United States Patent [19]

Glasser

[11] Patent Number: 4,661,233
[45] Date of Patent: Apr. 28, 1987

[54] CATHODE/GROUND SHIELD ARRANGEMENT IN A SPUTTER COATING APPARATUS

[75] Inventor: Albert D. Glasser, Columbia, S.C.

[73] Assignee: Westinghouse Electric Corp., Pittsburgh, Pa.

[21] Appl. No.: 858,325

[22] Filed: May 1, 1986

Related U.S. Application Data

[63] Continuation-in-part of Ser. No. 751,914, Jul. 5, 1985.

[51] Int. Cl.$^4$ ............................................. C23C 14/00
[52] U.S. Cl. .............................. 204/298; 204/192.12; 204/192.15; 376/419
[58] Field of Search ............................. 204/298, 192 R

[56] References Cited

U.S. PATENT DOCUMENTS

| | | | |
|---|---|---|---|
| 3,562,140 | 2/1971 | Skinner et al. | 204/298 |
| 3,632,494 | 1/1972 | Herte et al. | 204/192 |
| 4,080,281 | 3/1978 | Endo | 204/298 |
| 4,303,489 | 12/1981 | Morrison | 204/192 R |
| 4,312,731 | 1/1982 | Morrison | 204/192 R |
| 4,391,697 | 7/1983 | Morrison | 204/298 |
| 4,520,757 | 6/1985 | Nath et al. | 204/298 |
| 4,560,462 | 12/1985 | Radford et al. | 204/298 |
| 4,610,775 | 9/1986 | Phifer | 204/298 |

*Primary Examiner*—Arthur P. Demers

[57] ABSTRACT

A sputter coating apparatus target includes an elongated cathode having an upper support surface, sputter target material disposed upon the upper cathode surface, and a ground shield having a box-like construction. The ground shield includes a bottom wall and side walls containing the cathode therein in an enclosed state and an open top defined by the side walls adjacent to the upper cathode surface placing the target material in an exposed state. Also, blocks are provided for supporting the cathode within the shield in a spaced electrically insulated relationship relative to the shield such that a gap is defined between the cathode and the bottom and side walls of the shield. The cathode and ground shield are provided in an improved arrangement which includes the cathode having an upper peripheral edge surrounding its upper support surface and the side walls of the ground shield having upper edges surrounding and spaced outwardly from the upper peripheral edge of the cathode such that the gap between the ground shield and the cathode is exposed from a direction directly facing the open top of the ground shield. The upper edges of the shield side walls are displaced slightly below the upper peripheral edge of the cathode and means in the form of peripheral strips are attached to a retainer seated on the upper peripheral edge of the cathode and extend outwardly therefrom so as to overhang the upper edges of said ground shield side walls and cover exposure of the gap from the direction directly facing the open top of the ground shield. The outwardly extending strips are spaced above the upper edges of the ground shield side walls so as to relocate exposure of the gap from the direction facing the open top of the shield to directions angularly displaced therefrom and facing the side walls of the shield. Also, the gap is filled with a ceramic insulation material.

9 Claims, 12 Drawing Figures

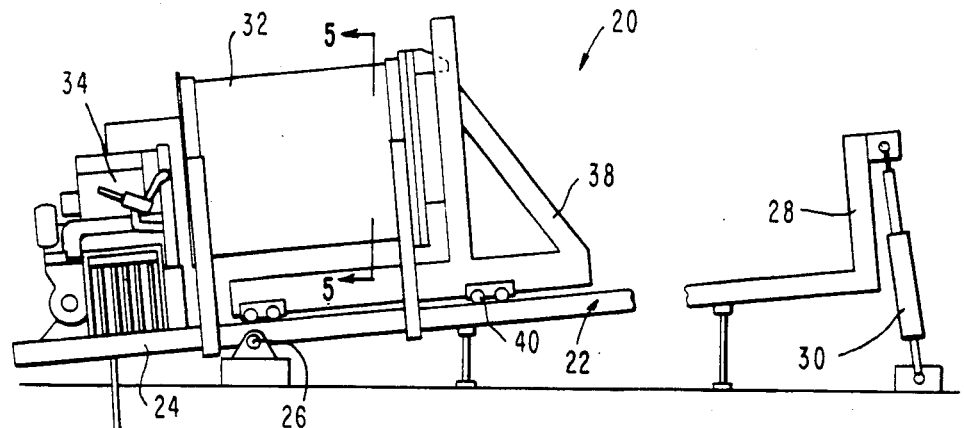
FIG. 1
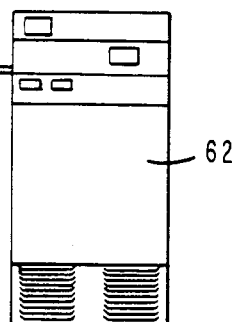
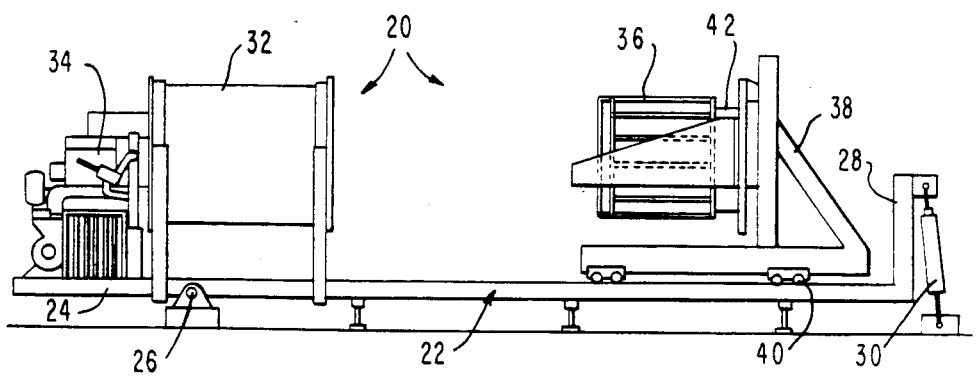
FIG. 2

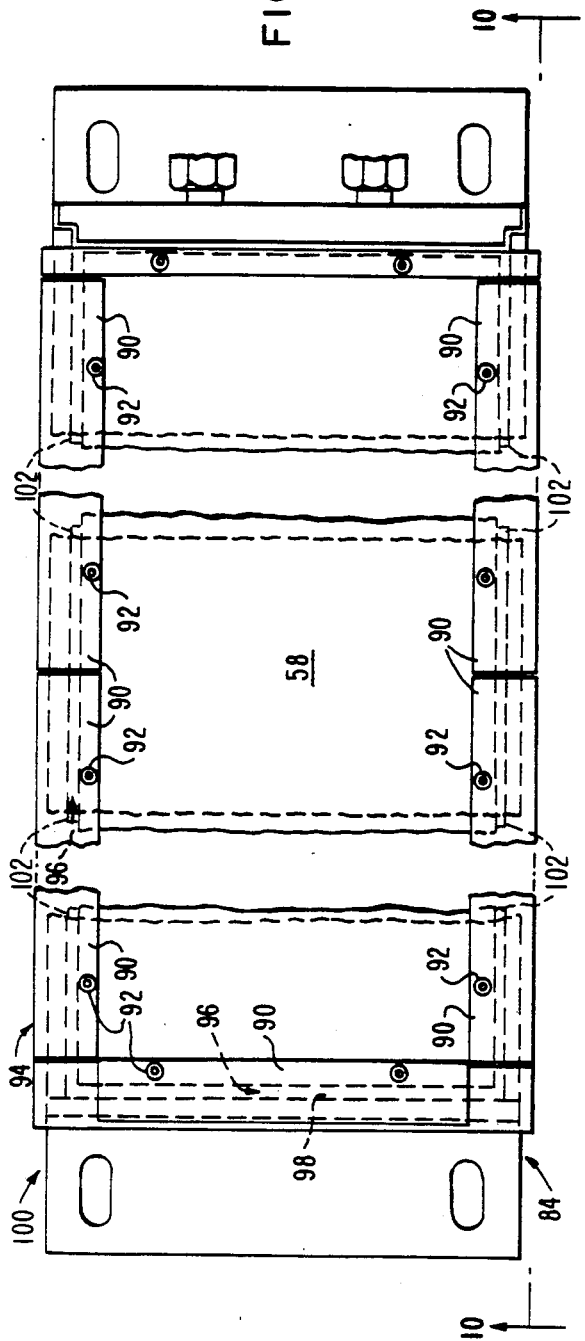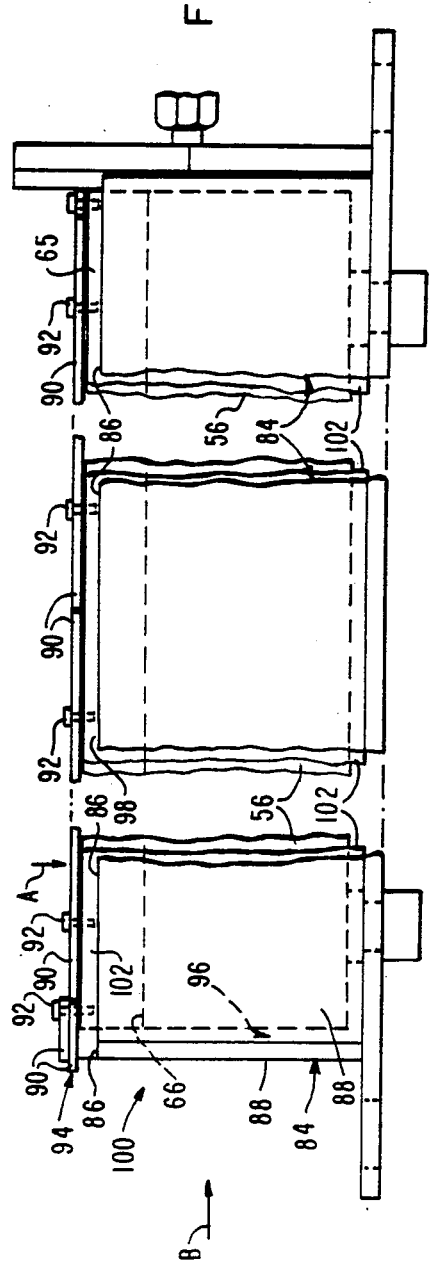

CATHODE/GROUND SHIELD ARRANGEMENT IN A SPUTTER COATING APPARATUS

This application is a continuation-in-part of copending U.S. patent application Ser. No. 751,914, filed July 5, 1985.

CROSS REFERENCE TO RELATED APPLICATIONS

Reference is hereby made to the following copending U.S. applications dealing with related subject matter and assigned to the assignee of the subject application:

1. "Coating A Nuclear Fuel With A Burnable Poison" by Kenneth C. Radford, assigned U.S. Ser. No. 526,712 and filed Aug. 26, 1983.
2. "Apparatus For Coating Nuclear Fuel Pellets With A Burnable Absorber" by Kenneth C. Keller et al, assigned U.S. Ser. No. 623,747 and filed June 22, 1984.

BACKGROUND OF THE INVENTION

1. Field of the Invention

The present invention relates generally to apparatus for depositing coatings on substrates and, more particularly, is concerned with an improved cathode/ground shield arrangement in a target of an apparatus for sputter coating nuclear fuel pellets.

2. Description of the Prior Art

Conventional nuclear fuel pellets commonly have the shape of generally right circular cylinders and contain fissionable material, such as uranium dioxide, thorium dioxide, plutonium dioxide, or mixtures thereof. The pellets are placed in end-to-end abutment within a cladding tube (typically made of a zirconium alloy or stainless steel) to make a fuel rod, and an array of such fuel rods are grouped together to form a fuel assembly. A plurality of fuel assembies are arranged together to constitute the core of a nuclear reactor.

As generally well-known, the life of a fuel assembly may be extended by combining an initially larger amount of fissionable material with a calculated smaller amount of burnable absorber. Burnable absorbers are materials (such as boron, gadolinium, samarium, europium, and the like) which have a high probability (or cross section) for absorbing neutrons, resulting in isotopes of sufficiently low neutron capture cross section so as to be substantially transparent to neutrons, all while producing no new or additional neutrons. The burnable absorber compensates for the larger amount of fissionable material during the early life of the fuel assembly. During reactor operation, the burnable absorbers are progressively reduced in amount, resulting in a longer life at relatively constant fission level for the fuel assembly. Longer fuel assembly life means less frequent nuclear reactor fuel assembly replacement. This refueling process is costly and time consuming.

Sputtering as a method for depositing a layer of burnable poison on nuclear fuel pellets is disclosed in the first patent application cross-referenced above. The second cross-referenced patent application discloses an apparatus for accomplishing the sputtering operation. Other sputtering apparatuses for depositing coatings on other types of products are disclosed in U.S. Pat. Nos. 3,562,140, 3,632,494 and 4,080,281.

In a typical sputter process, wherein a coating is deposited on a substrate, an inert gas is introduced into a vacuum chamber containing an anode, the substrate, and a target cathode. A high voltage is applied across the anode and the target cathode. The gas molecules are ionized and strike the target cathode. This causes atoms and/or molecules of the target cathode to be sputtered from the target cathode's surface. The substrate is positioned to intercept this sputtered target material which forms an adherent coating upon striking the substrate. Sputtering is a generally line-of-sight coating process.

In the apparatus of the second cross-referenced application, each of a plurality of targets includes a cathode and target material in the form of a plurality of rectangular tiles of zirconium diboride positioned on the top surface of the cathode. The cathode is usually made of copper with magnetic material inside which concentrates electrons in the vicinity of the cathode. This concentration enhances the generation of argon ions which collide with the negatively charged target material setting on the top surface of the cathode. However, the other surfaces of the cathode must be protected from the argon ions to keep from sputtering the material of the cathode itself.

Consequently, in the sputtering apparatus of the second cross-referenced application, each target also employs a ground shield used to protect these other cathode surfaces. The ground shield is positively charged, and therefore collects electrons and repels the argon ions. As shown in FIGS. 7 and 8 herein, the ground shield is physically located so that a narrow gap, for instance one-eighth to three-sixteenth of an inch, exists between the shield and the cathode. In this arrangement the ground shield is far enough away from the cathode to prevent an electric arc from occurring between them under normal conditions of relative humidity but close enough to prevent a plasma from starting because the electrons will have insufficient energy to ionize the argon.

However, problems have been recently discovered with the above-described arrangement of the ground shield and cathode of the target. Relative humidity in the sputter coating facility is frequently higher than normal because of high water vapor loads present from outgassing of the porous target tiles and from the nuclear fuel pellets being coated. High relative humidity has produced arcing and shorting of the cathodes used in the facility, occurring in the cathode to ground shield gap located on all sides of the cathode. These arcs are, at times, so severe that penetration of water cooling channels in the ground shield occurs, thus causing a water leak. A flake of zirconium diboride emanating from a location above the target material will land across the gap so as to cause a short circuit to arise between the oppositely charged ground shield and cathode. Such short circuit necessitates shutting down the coating apparatus, resulting in significant expense and loss of time. Consequently, a need exists for improvement of the sputtering apparatus to eliminate its susceptibility to occurrence of arc and short circuit conditions.

SUMMARY OF THE INVENTION

The present invention provides an improved ground shield/cathode arrangement in a sputter coating apparatus target designed to satisfy the aforementioned need. Underlying the present invention is the recognition that the problems with the prior arrangement was the location of the gap between the ground shield and cathode at the top of the target and the lack of a proper insulating material in the gap. In particular, the ground shield was arranged with respect to the cathode such that the gap therebetween opened at the top of the target.

There, it was exposed from above to falling flakes of zirconium diboride which could readily bridge the gap between the ground shield and cathode and create the short circuit. Also, in high relative humidity conditions, there was nothing to prevent arcing from arising across the gap.

The soluton of the present invention is to relocate the gap from the top of the target to the lateral sides thereof where it opens outwardly between the upper annular edge of the ground shield and an arrangement of peripheral strips which are spaced above the ground shield and connected to the upper peripheral edge of the cathode so as to overhang the ground shield upper edge. Now when flakes fall, some harmlessly land on the cathode where they usually stick to the target material surface and are resputtered or from where they later fall to the floor of the facility. Also, the gap is filled with a material of superior electrical resistivity, such as ceramic insulation.

Accordingly, the present invention sets forth in a sputter coating apparatus target including an elongated cathode having an outer support surface, sputter target material disposed upon the outer cathode surface, a ground shield containing the cathode in an enclosed state and having an open side adjacent to the outer cathode surface placing the target material in an exposed state, and means supporting the cathode within the shield in a spaced electrically insulated relationship relative to the shield such that a gap is defined between the cathode and the shield, the improvement which comprises: (a) the cathode having a peripheral edge surrounding the support surface; (b) the ground shield having an annular edge surrounding and spaced outwardly from the peripheral edge of the cathode such that the gap between the ground shield and the cathode is exposed at the edges thereof from a direction directly facing the open side of the ground shield, the annular edge of the ground shield being displaced from the peripheral edge of the cathode; and (c) means mounted on the peripheral edge of the cathode and extending outwardly therefrom so as to overhang the annular edge of the ground shield and cover exposure of the gap from the direction directly facing the open side of the ground shield.

More particularly, the outwardly extending means is in the form of an arrangement of peripheral strips which are spaced from the annular edge of the ground shield and seated on the peripheral edge of the cathode. The peripheral strips and the annular edge of the ground shield are spaced relative to one another so as to relocate exposure of the gap from the direction facing the open side of the shield to a direction angularly displaced therefrom.

Another improvement relates to electrical insulation material filling the gap for preventing arcing thereacross. The material is preferably a ceramic insulation, such as aluminum oxide.

These and other advantages and attainments of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the course of the following detailed description, reference will be made to the attached drawings in which:

FIG. 1 is a schematic view of a sputter coating apparatus which is intended to incorporate the improvements of the present invention.

FIG. 2 is a schematic view showing a drum removed from a chamber of the sputter coating apparatus of FIG. 1.

FIG. 9 is a fragmentary top plan view of one of the stationary targets of the sputter coating apparatus which incorporates the improvements of the present invention, with the target being illustrated on a larger scale than the prior art target of FIG. 7 and also being seen in longitudinally foreshortneed form.

FIG. 10 is a fragmentary side elevational view of the improved stationary target as seen along line 10—10 of FIG. 9.

DETAILED DESCRIPTION OF THE INVENTION

Figure 3:
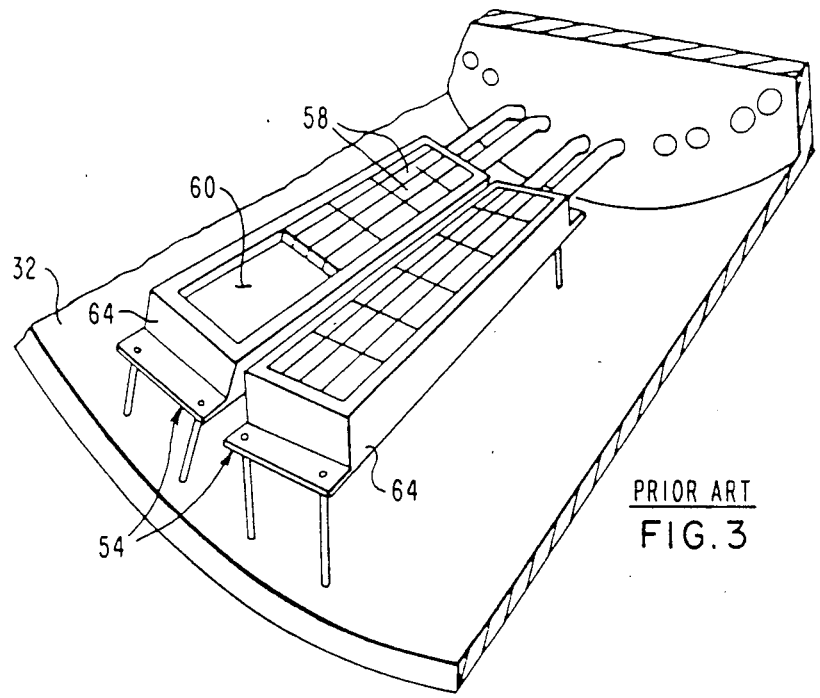
FIG. 3 is a fragmentary front perspective view of a lower portion of the open chamber of FIG. 2 looking inside, but showing the construction of the prior art stationary lower targets of the sputter coating apparatus before being improved in accordance with the present invention.

In the following description, like reference characters designate like or corresponding parts throughout the several views of the drawings. Also in the following description, it is to be understood that such terms as "forward", "rearward", "left", "right", "upwardly", "downwardly", and the like, are words of convenience and are not to be construed as limiting terms.

In General

Referring now to the drawings, and particularly to FIGS. 1 to 6, there is shown a nuclear fuel pellet sputter coating apparatus, generally designated by the numeral 20, within which the improvements of the present invention, to be described later, is intended to be incorporated. While the apparatus 20 is substantially the same as that described and illustrated in the second patent application cross-referenced above, it will be described briefly herein in order to facilitate a complete understanding of the improvement of the present invention.

Basically, the sputter coating apparatus 20 includes a frame which is pivotally mounted near one end 24 to a hinge 26 and supported at spaced locations along its longitudinal extent and at an opposite end 28 by a plurality of extendible and retractable cylinders 30. The apparatus 20 further includes a sputtering chamber 32 and a sputter machine 34 operatively associated therewith, both being stationarily mounted on the frame 22 at its one end 24.

Additionally, the apparatus 20 includes a drum 36 mounted on a support carriage 38 having rollers 40 for facilitating fore-and-aft movement of the drum 36 toward and away from the stationary sputtering chamber 32 (between the respective positions seen in FIGS. 1 and 2). Movement of the carriage 38 and drum 36 therewith is caused by tilting the frame 22 about the hinge 26 through actuation of the one of the cylinders 30 connected to the opposite end 28 of the frame. The drum 36 is also mounted on the carriage 38 for rotation about its longitudinal axis. A motor 42 also supported on the carriage 38 is coupled to the drum 36 for rotatably driving the same. The drum 36 is adapted to from a hermetic seal with the sputtering chamber 32 when inserted therein as seen in FIG. 1.

Figure 4:
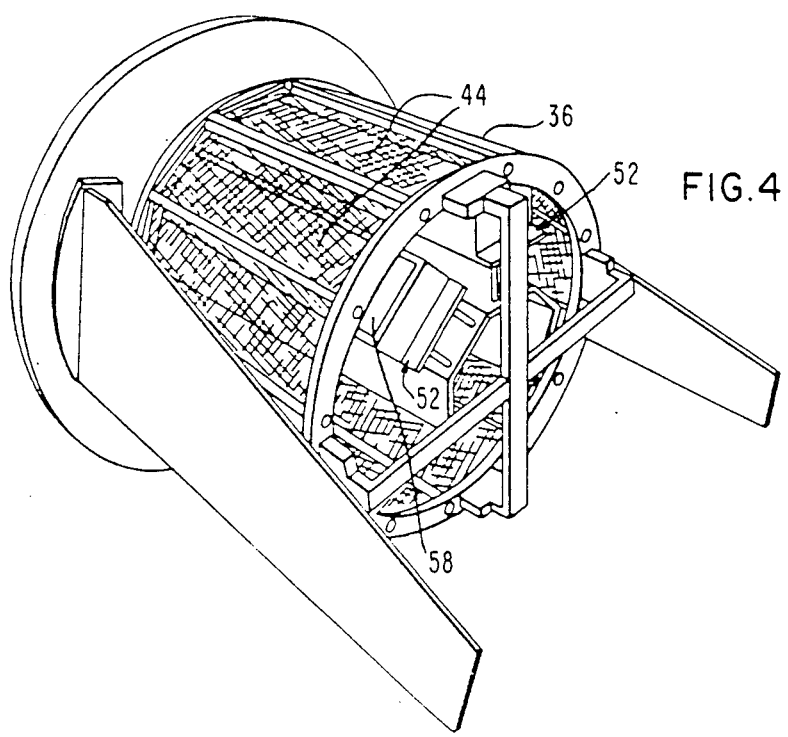
FIG. 4 is a back perspective view of the drum of FIG. 2, but also depicting the construction of the prior art stationary upper targets of the sputter coating apparatus before being improved in accordance with the present invention.
Figure 5:
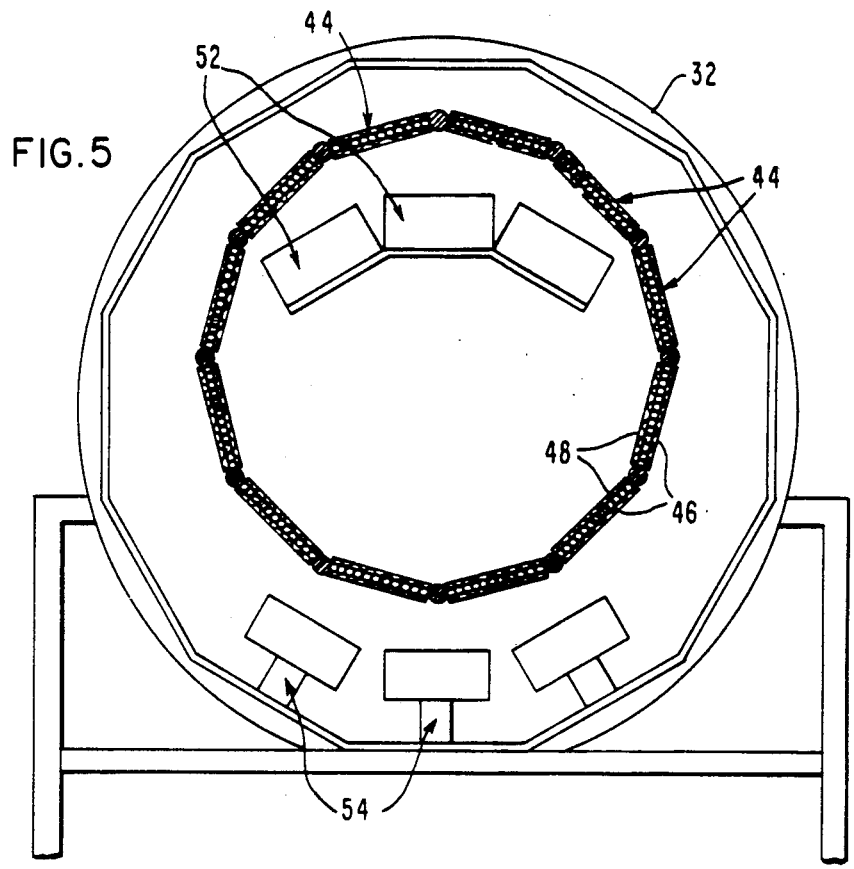
FIG. 5 is a schematical sectional view along line 5—5 of FIG. 1, showing the pellet-containing pallets on the drum and the accompanying stationary lower and upper targets.
Figure 6:
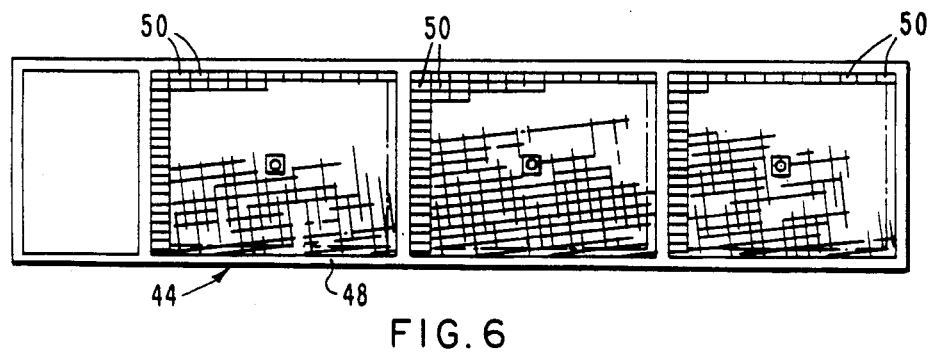
FIG. 6 is a top plan view, with portions broken away, of one of the enclosed pallets of FIG. 5 detached from the drum, showing the pellets to be sputter coated being disposed in rows and columns therein.

About the circumference of the drum 36 are mounted a number of detachable enclosed pallets 44 with lower and upper screened parts 46,48. Each pallet 44 contains a single layer of nuclear fuel pellets 50, being preferably aligned end-to-end in columns and rows, as seen in FIG. 6. The sputter machine 34 has stationary upper and lower targets 52,54 which are mounted within the sputtering chamber 32, as depicted in FIGS. 3 to 5. The targets 52,54 each include a cathode 56 with a number of target tiles 58 resting on an upper surface 60 of the cathode. The material of the tiles 58, preferably zirconium diboride, is sputtered as a coating onto the nuclear fuel pellets 50 as the pallets 44 within which the pellets 50 are mounted are rotated with the drum 36. A control console 62 is used to control the drum motor 42 and the sputter machine 34. The drum 36 is made of an anode for the sputter machine.

Prior Art Ground Shield/Cathode Arrangement

Figure 7:
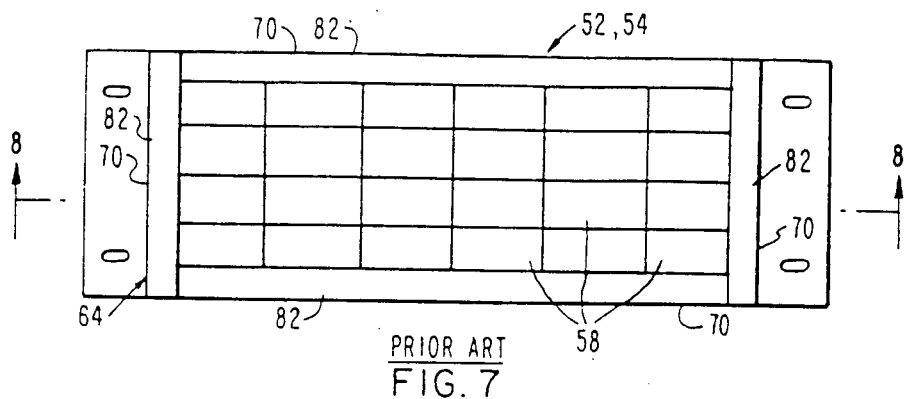
FIG. 7 is an enlarged top plan view of one of the prior art stationary targets of FIGS. 3 and 4, depicting the construction thereof before being improved in accordance with the present invention.
Figure 8:
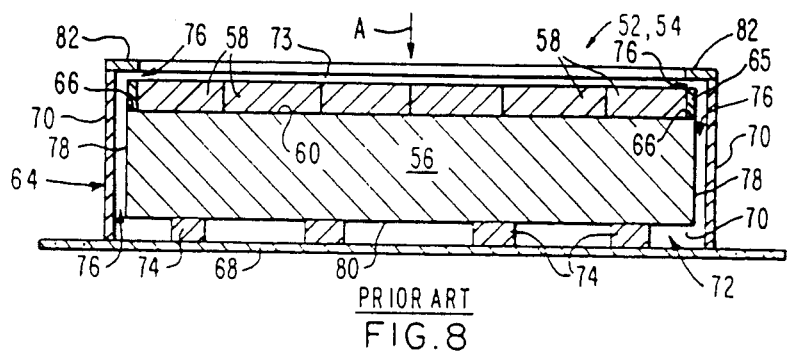
FIG. 8 is a vertical longitudinal sectional view of the prior art stationary target as taken along line 8—8 of FIG. 7.
Figure 11:
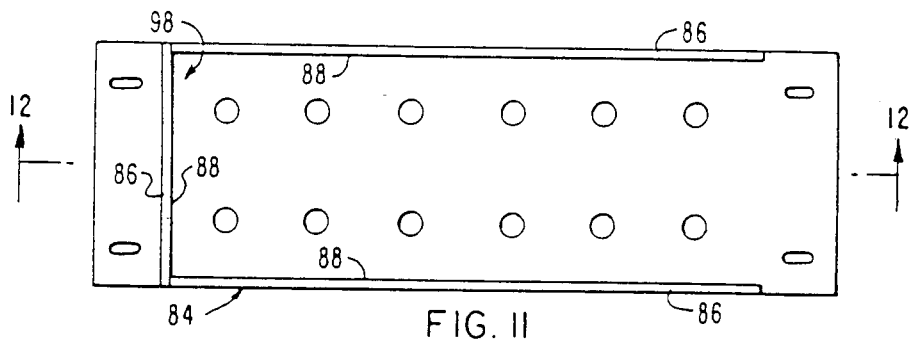
FIG. 11 is a top plan view of the ground shield of the improved target of FIGS. 9 and 10, but on a smaller scale.
Figure 12:
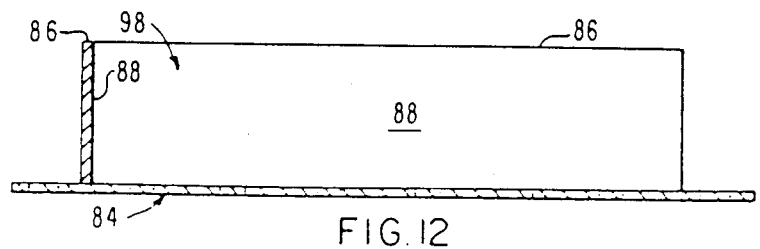
FIG. 12 is a vertical longitudinal sectional view of the ground shield as taken along line 12—12 of FIG. 11.

Turning to FIGS. 7 and 8, there is shown the construction of each of the targets 52,54 used heretofore in the sputter coating apparatus 20. Each target 52,54 basically includes the cathode 56, the plurality of target tiles 58, and a ground shield 64. The cathode 56 has an elongated generally rectangular shape, is made of electrically conductive material and has the upper support surface 60. The plurality of target tiles 58, being formed of sputter frangible material, such as zirconium diboride, are disposed in the form of a layer upon the upper cathode surface 60. The cathode 56 has a retainer 65 mounted on an upper peripheral edge 66 thereof which surrounds and bounds its upper support surface 60 for retaining the layer of target tiles 58 in place on the support surface.

The ground shield 64 is made of electrically conductive material and has a box-like construction including a bottom wall 68 and side walls 70 which define a hollow cavity 72 and an open top 73. The interior dimensions of the cavity 72 are slightly greater than the exterior dimensions of the cathode 56. Thus, when the cathode is placed therein and supported on means, such as insulator blocks 74, on the bottom wall 68 of the ground shield 64, the cathode 56 will be disposed in a spaced electrically insulated relationship relative to the shield in which a gap 76 is defined between the cathode and the bottom and side walls 68,70 of the shield 64. In such position, the cathode 56 is contained within the ground shield 64 in an enclosed or covered state about all of its sides 78 and its bottom 80. However, the open top 73 defined by the side walls 70 of the shield 64 adjacent to the upper surface 60 of the cathode 56 places the layer of target tiles 58 resting thereon in an exposed state. With such arrangement, all of the cathode surfaces except its upper one which supports the target tiles 58 are protected from being struck and sputtered by argon ions.

However, the side walls 70 of the ground shield 64 have upper inwardly-directed flanges 82 surrounding and spaced above the retainer 65 on the upper peripheral edge 66 of the cathode 56 such that the gap 76 between the ground shield 64 and the cathode 56 is open and exposed from a direction, designated by the arrow A in FIG. 8, directly facing the open top 73 of the ground shield 64. This is the direction in which the flakes of zirconium diboride would fall onto the cathode 56 from a location above the targets 54,54. Thus, the upper flanges 82 of the ground shield 64 and the target 58 and/or upper peripheral retainer 65 on the cathode 56 provide oppositely charged surfaces between which a short circuit is completed when a flake occasionally happens to bridge the gap 76 and contact both flange 82 and retainer 65 (and/or target 58).

Improved Ground Shield/Cathode Arrangement

Referring finally to FIGS. 9 to 12, there is shown the improved cathode/ground shield arrangement of the present invention. The ground shield 84 is generally similar to the prior art ground shield 64 except the upper edges 86 of its side walls 88 are displaced slightly below the upper peripheral edge of the target 58.

In addition, means in the form of peripheral retainer strips 90 are arranged along the shield edges 86 and the cathode edge 66. The strips 90 are spaced above upper edges 86 of the ground shield side walls 88 and connected by fasteners 92 to the upper peripheral edge 66 of the cathode 56. Thus, the strips 90 provide a continuous peripheral ledge 94 attached on the retainer 65 on the cathode upper peripheral edge 66 and extending outwardly therefrom so as to overhang the shield side wall upper edges 86.

In such arrangement, the strips 90 cover exposure of the gap 96 from the direction "A" directly facing the open top 98 of the ground shield 84. Instead, the strips 90 in being spaced directly above the upper edges 86 of the ground shield side walls 88 relocate exposure of the gap 96 from direction "A" to direction "L" angularly displaced therefrom and facing the side walls 88 of the shield 84. Thus, flakes of zirconium diboride will no longer be able to short circuit the gap 96 between the cathode 56 (or now the strips 90 which are electrically conductive and of the same polarity as the cathode) and the ground shield 84 which opens at the lateral sides of the target 100.

Also, electrical insulation material 102 is provided to fill the gap 96 for inhibiting and preventing the creation of arcing across the gap between the cathode 56 and ground shield 84 due to the presence of a condition of high relative humidity in the environment surrounding the cathode and shield. The insulation material 102 is configured to fill the gap 96 so as to leave no perceptible space. Preferably, ceramic insulation composed of aluminum oxide is used. However, other ceramic insulation such as aluminum silicate and pyrex can also be used.

It is thought that the improvement provided by the present invention and many of its attendant advantages will be understood from the foregoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

I claim:

1. In a sputter coating apparatus target including an elongated cathode having an outer support surface, sputter target material disposed upon said outer cathode surface, a ground shield containing said cathode in an enclosed state and having an open side adjacent to said outer cathode surface placing said target material in an exposed state, means supporting said cathode within said shield in a spaced electrically insulated relationship relative to said shield such that a gap is defined between said cathode and said shield, the improvement which comprises:
   (a) said cathode having a peripheral edge surrounding said support surface;
   (b) said ground shield having an annular edge surrounding and spaced outwardly from said peripheral edge of said cathode such that said gap between said ground shield and said cathode is exposed at said edges thereof from a direction directly facing said open side of said ground shield, said annular edge of said shield being displaced from said peripheral edge of said cathode; and
   (c) means mounted on said peripheral edge of said cathode and extending outwardly therefrom so as to overhang said annular edge of said ground shield and cover exposure of said gap from said direction directly facing said open side of said ground shield.

2. The improved target as recited in claim 1, wherein said outwardly extending means is in the form of an arrangement of peripheral strips which are spaced from said annular edge of said ground shield and seated on said peripheral edge of said cathode.

3. The improved target as recited in claim 1, wherein said outwardly extending means and said annular edge of said ground shield are spaced relative to one another so as to relocate exposure of said gap from said direction facing said open side of said shield to a direction angularly displaced therefrom.

4. The improved target as recited in claim 1, further comprising insulation material filling said gap between said cathode and shield.

5. In a sputter coating apparatus target including an elongated cathode having an upper support surface, sputter target material disposed upon said upper cathode surface, a ground shield having a box-like construction including a bottom wall and side walls containing said cathode therein in an enclosed state and an open top defined by said side walls adjacent to said upper cathode surface placing said target material in an exposed state, means supporting said cathode within said shield in a spaced insulated relationship relative to said shield such that a gap is defined between said cathode and said bottom and side walls of said shield, the improvement which comprises:
   (a) said cathode having an upper peripheral edge surrounding said support surface;
   (b) said side walls of said ground shield having upper edges surrounding and spaced outwardly from said upper peripheral edge of said cathode such that said gap between said ground shield and said cathode is exposed from a direction directly facing said open top of said ground shield, said upper edges of said shield side walls being displaced slightly below said upper peripheral edge of said cathode; and
   (c) means attached on said upper peripheral edge of said cathode and extending outwardly therefrom so as to overhang said upper edges of said ground shield side walls and cover exposure of said gap from said direction directly facing said open top of said ground shield, said outwardly extending means being spaced above said upper edges of said ground shield side walls so as to relocate exposure of said gap from said direction facing said open top of said shield to directions angularly displaced therefrom and facing said side walls of said shield.

6. The improved target as recited in claim 5, wherein said outwardly extending means is in the form of an arrangement of peripheral strips which are spaced above said upper edges of said ground shield side walls and seated on said upper peripheral edge of said cathode.

7. The improved target as recited in claim 6, wherein said cathode, strips and ground shield are formed of electrically conductive material.

8. The improved target as recited in claim 5, further comprising insulation material filling said gap between said cathode and shield.

9. The improved target as recited in claim 8, wherein said insulation material is aluminum oxide.

* * * * *